United States Patent
Hattori et al.

(10) Patent No.: US 10,218,288 B2
(45) Date of Patent: Feb. 26, 2019

(54) POWER CONVERSION CIRCUIT BOARD, AND ELECTRIC COMPRESSOR

(71) Applicant: MITSUBISHI HEAVY INDUSTRIES THERMAL SYSTEMS, LTD., Tokyo (JP)

(72) Inventors: Makoto Hattori, Kiyosu (JP); Hiroyuki Kamitani, Kiyosu (JP); Hiroto Higuchi, Kiyosu (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 0 days.

(21) Appl. No.: 15/559,607

(22) PCT Filed: Feb. 15, 2016

(86) PCT No.: PCT/JP2016/054251
§ 371 (c)(1),
(2) Date: Sep. 19, 2017

(87) PCT Pub. No.: WO2016/152312
PCT Pub. Date: Sep. 29, 2016

(65) Prior Publication Data
US 2018/0069487 A1 Mar. 8, 2018

(30) Foreign Application Priority Data
Mar. 23, 2015 (JP) .................................. 2015-059208

(51) Int. Cl.
*H02M 3/335* (2006.01)
*H02M 7/48* (2007.01)
(Continued)

(52) U.S. Cl.
CPC ............... *H02M 7/48* (2013.01); *F04B 35/04* (2013.01); *F04B 39/00* (2013.01); *F04B 39/121* (2013.01);
(Continued)

(58) Field of Classification Search
CPC ...... B60L 1/00; B60L 11/18; B60L 2240/525; Y02T 10/7005; H02M 7/44; H02M 7/5387; H02M 7/003
(Continued)

(56) References Cited

U.S. PATENT DOCUMENTS 5,963,442 A * 10/1999 Yoshida .................... B60L 1/00
318/801
8,422,235 B2 * 4/2013 Azuma .................. B60K 6/445
361/688
(Continued)

FOREIGN PATENT DOCUMENTS

CN 1200010 A 11/1998
CN 101162855 A 4/2008
(Continued)

OTHER PUBLICATIONS

International Search Report dated Apr. 26, 2016 in Application No. PCT/JP2016/054251 with an English Translation.
(Continued)

*Primary Examiner* — Rajnikant Patel
(74) *Attorney, Agent, or Firm* — Birch, Stewart, Kolasch & Birch, LLP (57) ABSTRACT

A power conversion circuit board (1) is a board on which a power conversion circuit which converts direct current to alternating current is mounted. A low voltage circuit (10b) to which a low voltage is applied and a high voltage circuit (10a) to which a high voltage is applied are separately disposed in different areas on the same board surface.
(Continued)

Further, the high voltage circuit (10*a*) includes a bus bar in which a part of a wiring is formed on the board surface and another wiring is provided with a predetermined distance from the board surface.

4 Claims, 6 Drawing Sheets

(51) Int. Cl.
| | |
|---|---|
| *F04B 39/00* | (2006.01) |
| *H02K 11/33* | (2016.01) |
| *F04B 35/04* | (2006.01) |
| *F04B 39/12* | (2006.01) |
| *H02P 27/06* | (2006.01) |
| *H05K 1/02* | (2006.01) |
| *H02M 7/00* | (2006.01) |

(52) U.S. Cl.
CPC .............. *H02K 11/33* (2016.01); *H02P 27/06* (2013.01); *H05K 1/02* (2013.01); *H05K 1/0263* (2013.01); *F04B 2203/0204* (2013.01); *H02M 7/003* (2013.01); *H05K 1/0262* (2013.01); *H05K 2201/10166* (2013.01); *H05K 2201/10189* (2013.01); *H05K 2201/10272* (2013.01)

(58) Field of Classification Search
USPC .............. 363/16–20, 98, 132; 318/807, 812; 361/22, 23, 25
See application file for complete search history.

(56) References Cited

U.S. PATENT DOCUMENTS

| | | | | |
|---|---|---|---|---|
| 9,042,147 | B2* | 5/2015 | Ishii ..................... | H02M 7/003 |
| | | | | 361/677 |
| 9,350,228 | B2* | 5/2016 | Uetake .................. | H02M 7/003 |
| 2004/0257841 | A1* | 12/2004 | Taguchi .................. | H02M 1/12 |
| | | | | 363/40 |
| 2006/0152085 | A1* | 7/2006 | Flett ......................... | B60L 9/30 |
| | | | | 307/75 |
| 2008/0087458 | A1 | 4/2008 | Hattori et al. | |
| 2009/0291002 | A1 | 11/2009 | Kasai et al. | |
| 2010/0014988 | A1 | 1/2010 | Tsutsui et al. | |
| 2010/0163282 | A1 | 7/2010 | Tagi et al. | |
| 2013/0094269 | A1* | 4/2013 | Maeda .................. | H02M 7/003 |
| | | | | 363/141 |
| 2013/0265808 | A1 | 10/2013 | Ishii et al. | |

FOREIGN PATENT DOCUMENTS

| | | | |
|---|---|---|---|
| CN | 101507372 A | | 8/2009 |
| CN | 101589541 A | | 11/2009 |
| CN | 103299532 A | | 9/2013 |
| JP | 11-189032 | * | 7/1999 |
| JP | 11-189032 A | | 7/1999 |
| JP | 2000-151041 A | | 5/2000 |
| JP | 2008-220005 A | | 9/2008 |
| JP | 2011-229397 A | | 11/2011 |
| JP | 4981483 B2 | | 4/2012 |

OTHER PUBLICATIONS

Written Opinion dated Apr. 26, 2016 in Application No. PCT/JP2016/054251 with an English Translation.

* cited by examiner

POWER CONVERSION CIRCUIT BOARD, AND ELECTRIC COMPRESSOR

TECHNICAL FIELD

The present invention relates to a power conversion circuit board and an electric compressor.

Priority is claimed on Japanese Patent Application No. 2015-059208, filed Mar. 23, 2015, the content of which is incorporated herein by reference.

BACKGROUND ART

For example, an in-vehicle air conditioner is required to have a high space-saving property because of the necessity to house various configuration devices in a limited space inside the vehicle. For this reason, in recent years, for the purpose of enhancing the space-saving property, an integrated electric compressor in which a compressor constituting an in-vehicle air conditioner, a motor for driving the compressor, and a circuit board for controlling the compressor are integrally configured has been suggested (e.g., see Patent Literature 1).

CITATION LIST

Patent Literature

[Patent Literature 1]
Japanese Unexamined Patent Application, First Publication No. 2008-220005

SUMMARY OF INVENTION

Technical Problem

However, in the circuit board of the integrated electric compressor, a circuit of a small signal system operating at a relatively low voltage, and a circuit of a large electric power system to which a high voltage necessary for driving the motor is applied exist together. In order to save space, if the density of the elements constituting the small signal system circuit and the density of the elements constituting the high power system circuit increase, various electromagnetic noises radiated on the basis of the operation in the circuit of the high power system are assumed to adversely affect the operation of the circuit of the small signal system.

The present invention has been made in view of the above-described problems, and an object thereof is to provide a power conversion circuit board and an electric compressor that can reduce the influence of electromagnetic noise, while maintaining the space saving.

Solution to Problem

An aspect of the present invention is a power conversion circuit board on which a power conversion circuit configured to convert direct current to alternating current is mounted, wherein a low voltage circuit to which a low voltage is applied, and a high voltage circuit to which a high voltage is applied are separately disposed in different areas on the same board surface.

With such a configuration, since the high voltage circuit and the low voltage circuit are separately disposed, it is possible to reduce the degree of interference of the electromagnetic noise radiated from the high voltage circuit to the low voltage circuit. Further, since the high voltage circuit and the low voltage circuit are disposed on the same board surface, space saving can be achieved. Accordingly, it is possible to reduce the influence of electromagnetic noise, while maintaining the space-saving property.

Further, according to an aspect of the present invention, in the above-described power conversion circuit board, in the high voltage circuit, a wiring from a high voltage input terminal to a switching element is formed on the board surface, and a wiring from the switching element to a high voltage output terminal comprises a bus bar which is provided at a predetermined distance from the board surface.

With such a configuration, electromagnetic noise generated by driving of the switching element is absorbed between the wiring formed on the board surface and the bus bar provided at a predetermined distance from the board surface. Thus, electromagnetic noise can be prevented from being radiated to the outside.

Further, according to an aspect of the present invention, in the above-described power conversion circuit board, the wiring from the high voltage input terminal to the switching element, and the wiring from the switching element to the high voltage output terminal are disposed to intersect with each other.

With such a configuration, since the electromagnetic noise generated by driving of the switching element is effectively absorbed by the portions in which the electromagnetic noises intersect with each other, it is possible to more effectively suppress the electromagnetic noise from being radiated to the outside. Further, by providing a region in which they overlap, the region of the power conversion circuit board occupied by the high voltage circuit can be compactly integrated into one. Therefore, the entire power conversion circuit board can be further downsized.

Further, according to an aspect of the present invention, in the above-described power conversion circuit board, at least a part of an RC circuit is provided in a space provided between the wiring from the high voltage input terminal to the switching element and the wiring from the switching element to the high voltage output terminal.

With such a configuration, it is possible to obtain an effect of removing electromagnetic noise using the RC circuit. Further, in order to secure the space required for mounting the RC circuit, it is possible to effectively utilize the space provided between the wiring from the high voltage input terminal to the switching element and the wiring from the switching element to the high voltage output terminal. Therefore, it is possible to achieve further space saving of the power conversion circuit board.

Further, an aspect of the present invention is an electric compressor including the aforementioned power conversion circuit board; and a motor which operates on the basis of AC power supplied from the power conversion circuit board.

Advantageous Effects of Invention

According to the above-described power conversion circuit board and electric compressor, it is possible to reduce the influence of electromagnetic noise, while maintaining the space saving.

DESCRIPTION OF EMBODIMENTS

First Embodiment

Hereinafter, a power conversion circuit board according to the first embodiment will be described with reference to FIGS. 1 to 7.
(Overall Structure)

Figure 1:
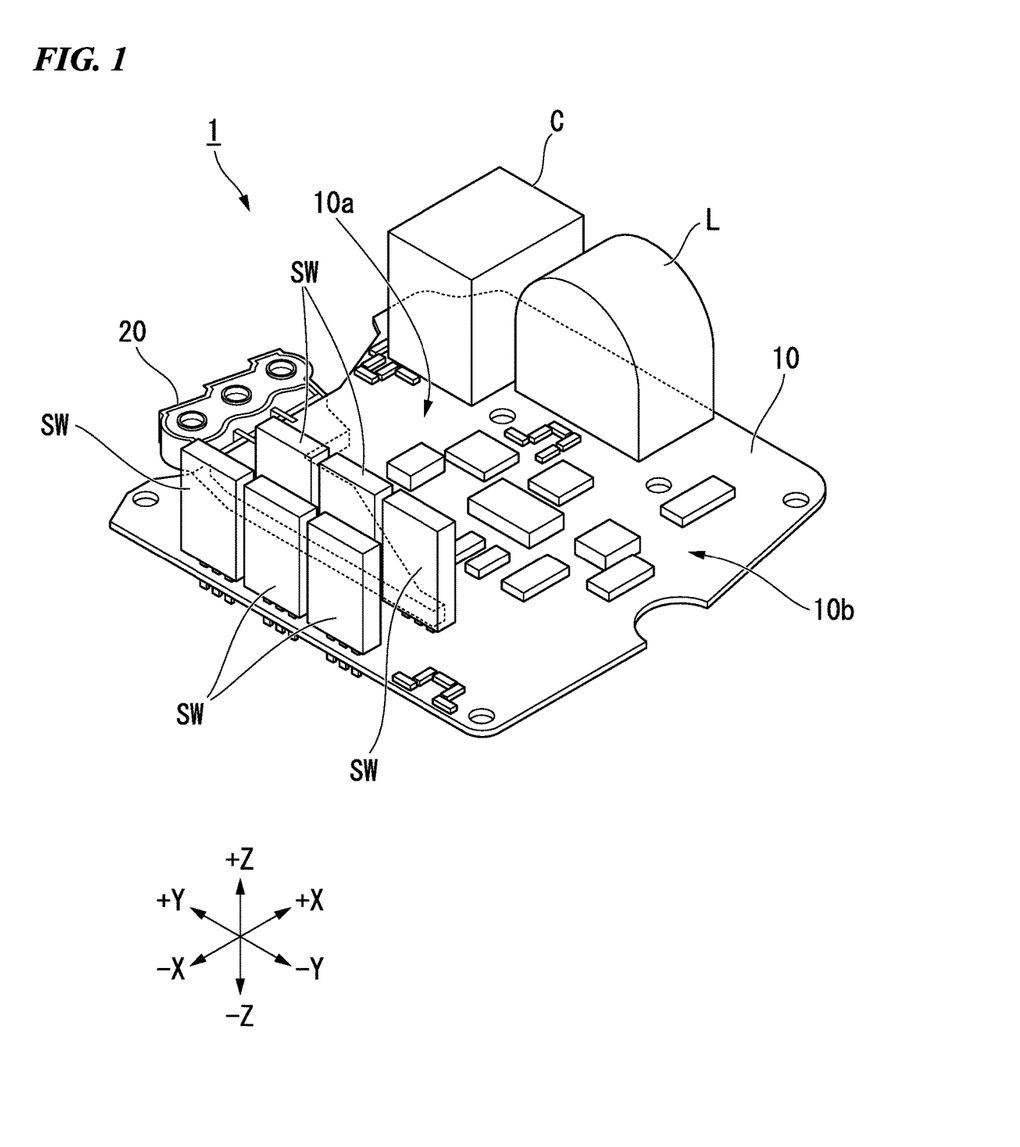
FIG. 1 is a perspective view of a power conversion circuit board according to a first embodiment.

FIG. 1 is a perspective view of a power conversion circuit board according to the first embodiment.

Figure 2:
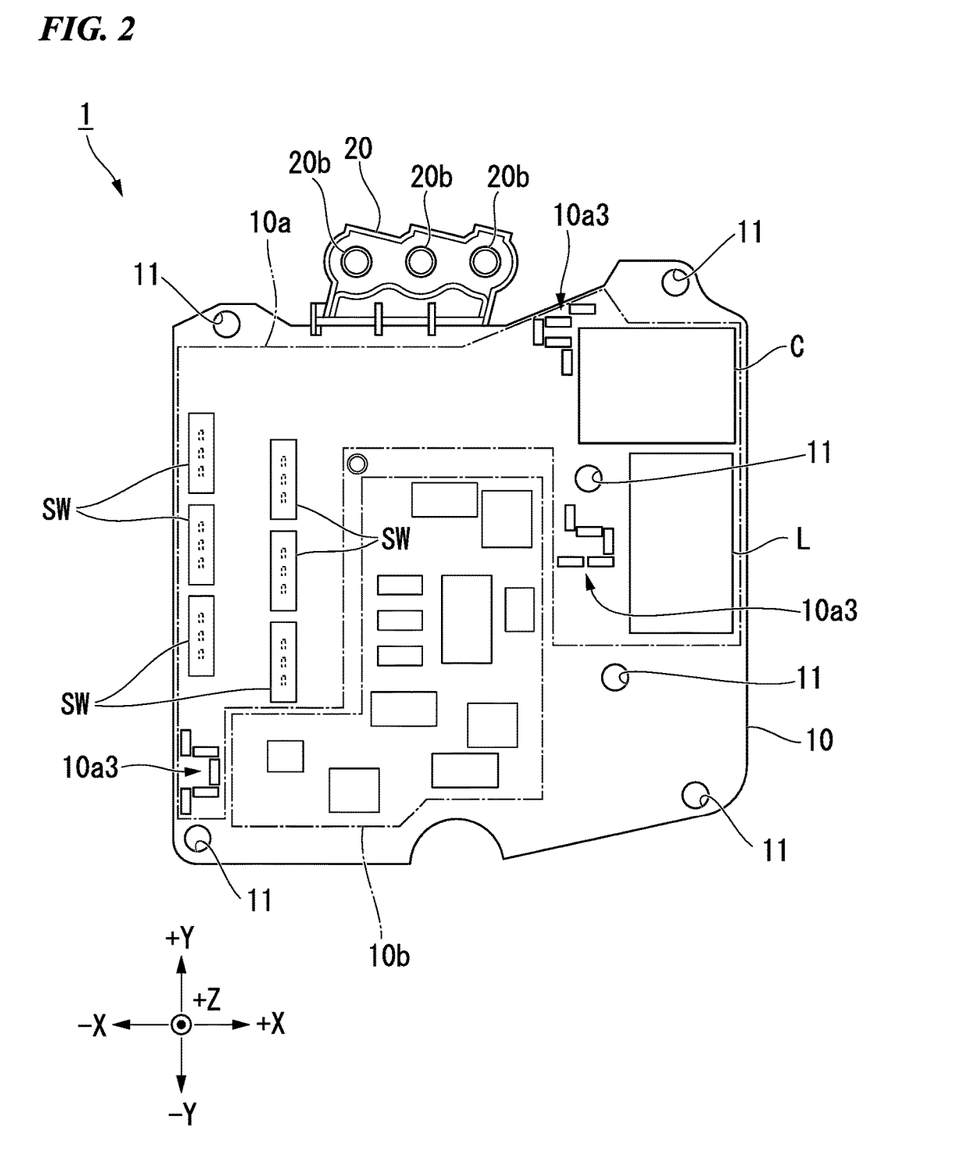
FIG. 2 is a plan view of a power conversion circuit board according to the first embodiment.

Further, FIG. 2 is a plan view of the power conversion circuit board according to the first embodiment.

Figure 3:
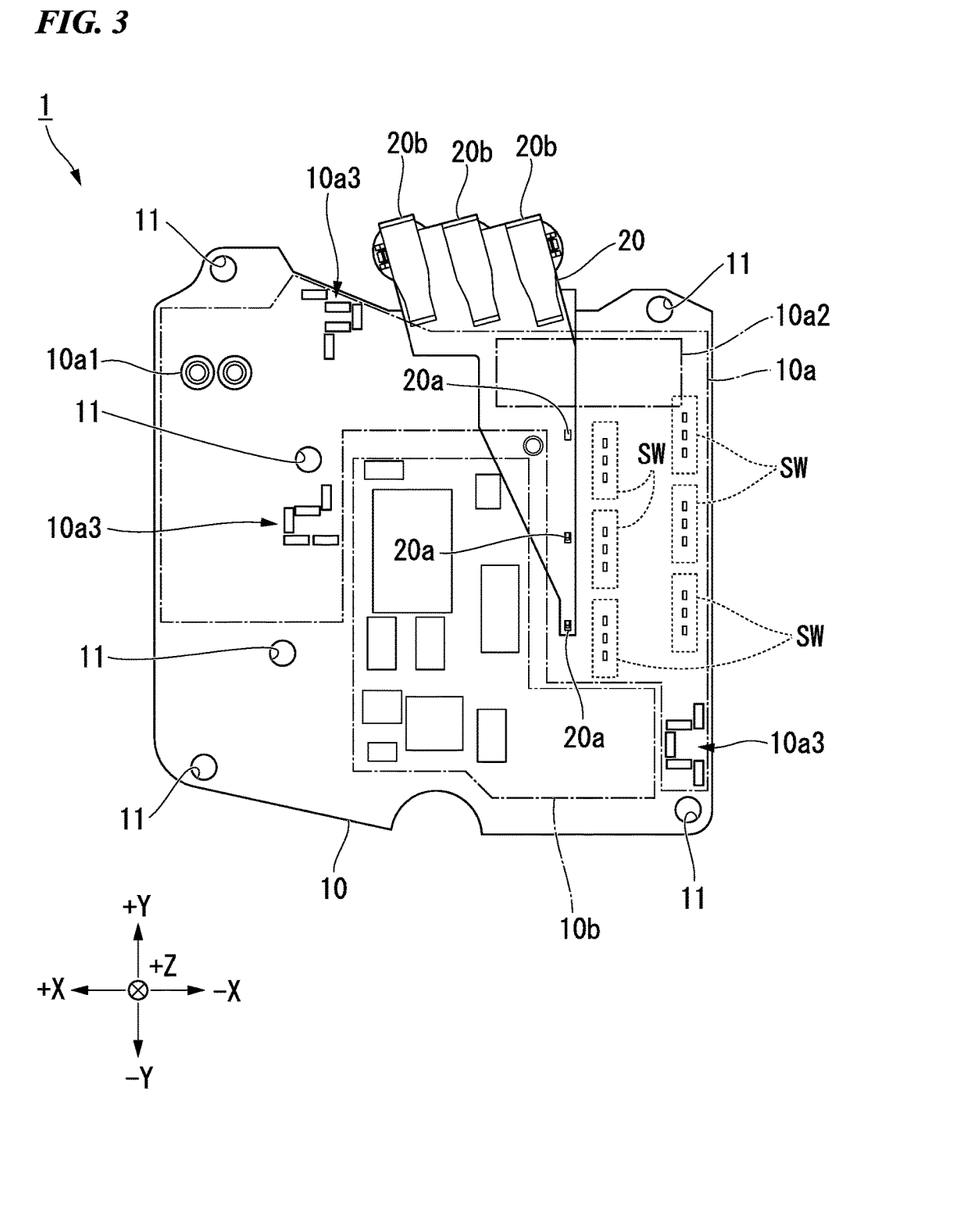
FIG. 3 is a bottom view of the power conversion circuit board according to the first embodiment.

Further, FIG. 3 is a bottom view of the power conversion circuit board according to the first embodiment.

Figure 4:
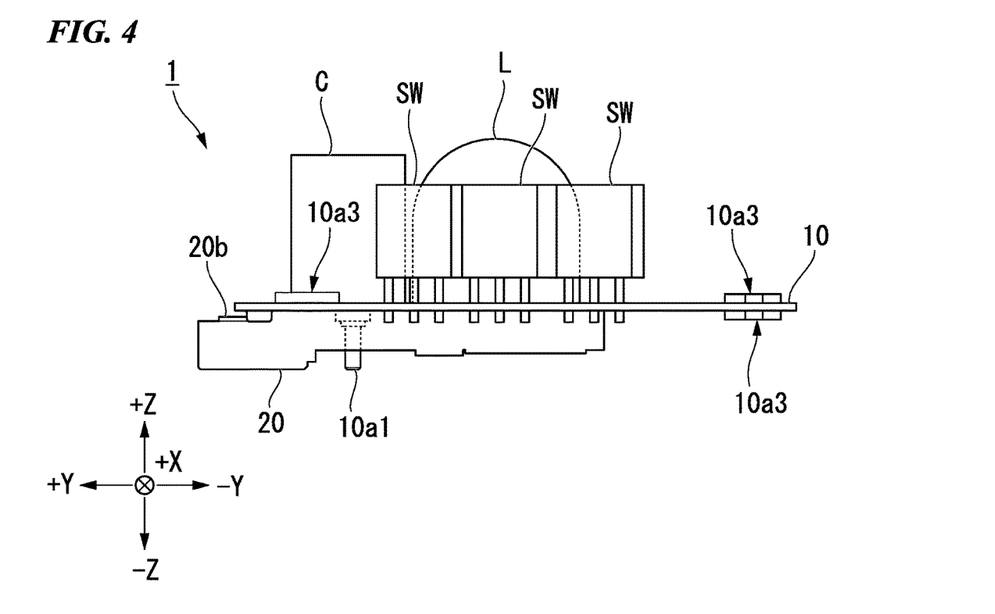
FIG. 4 is a side view of the power conversion circuit board according to the first embodiment.

Further, FIG. 4 is a side view of the power conversion circuit board according to the first embodiment.

Figure 5:
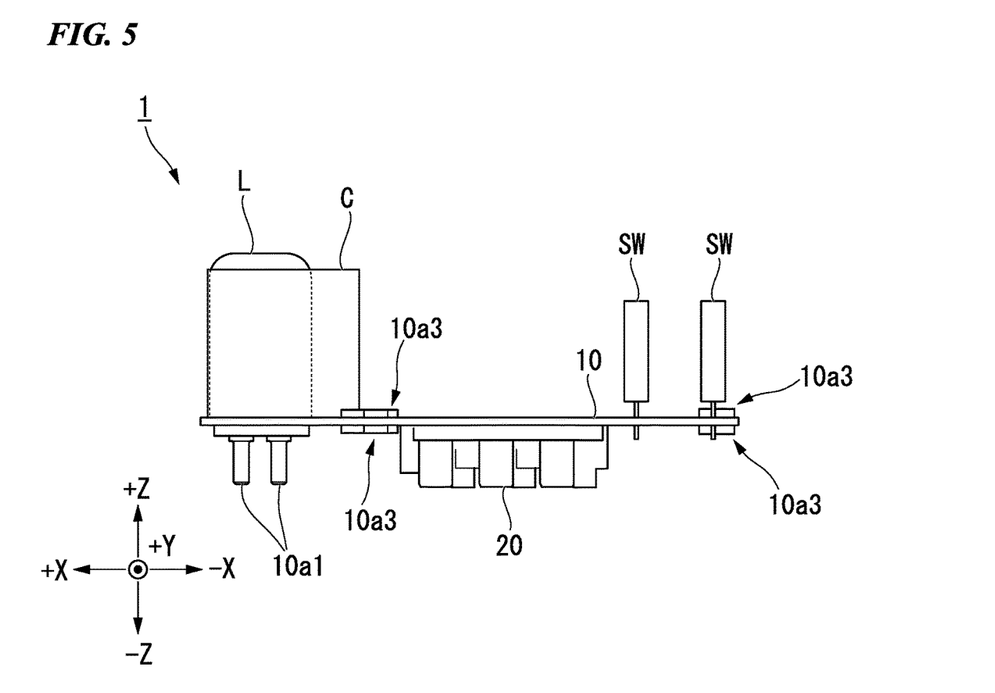
FIG. 5 is a front view of the power conversion circuit board according to the first embodiment.

Further, FIG. 5 is a front view of the power conversion circuit board according to the first embodiment.

The power conversion circuit board 1 according to the first embodiment is a circuit board which constitutes an inverter that converts DC power supplied from the outside through an input terminal (described later) into three-phase AC power. Here, the power conversion circuit board 1 according to the first embodiment is mounted integrally on the electric compressor, together with an AC motor that operates on the basis of the three-phase AC power which is output from the power conversion circuit board 1.

The electric compressor is used, for example, in an air conditioner (car air conditioner) mounted in a vehicle. In this case, the electric compressor (the power conversion circuit board 1) receives the input of the DC power from a battery or the like mounted in the vehicle.

As illustrated in FIGS. 1 to 5, the power conversion circuit board 1 includes a board main body portion 10 and a bus bar support member 20.

The board main body portion 10 is a circuit board on which various circuit elements for configuring a power conversion circuit (inverter) which converts direct current to alternating current are mounted. As illustrated in FIG. 1 and the like, a part of a high voltage circuit 10a to which a high voltage is applied, and a low voltage circuit 10b to which a low voltage is applied are separately disposed on the board surface of board main body portion 10 (including both a surface on a +Z direction side and a surface on a −Z direction side) in different areas.

The high voltage circuit 10a is a circuit of a high-power system to which a high voltage required for driving an AC motor (not illustrated) is applied. Specifically, a DC high voltage which is input from a battery or the like mounted on a vehicle is applied to the high voltage circuit 10a. The input DC high voltage is converted into three-phase AC power for driving the AC motor through a switching element SW.

Each switching element SW is switched into an ON state in which a current flows and an OFF state in which a current is interrupted, on the basis of a driving signal (gate input) from the low voltage circuit 10b (which will be described later). Each of two switching elements SW is provided to correspond to each of a U-phase, a V-phase, and a W-phase which form a three-phase alternating current. Therefore, a total of six switching elements SW are mounted on the board surface of the board main body portion 10. Three phases (U-phase, V-phase, and W-phase) of AC power are supplied to the AC motor by repeatedly turning ON/OFF at a prescribed timing using each switching element SW.

As the switching element SW, for example, an insulated gate bipolar transistor (IGBT) is representative, but aside from this, a bipolar transistor, a metal-oxide-semiconductor field effect transistor (MOSFET) or the like may be used.

Meanwhile, the low voltage circuit 10b is a circuit of small signal system which operates at a lower voltage than the high voltage circuit 10a. Specifically, a control chip such as a microcomputer or various kinds of sensors such as a current sensor are mounted on the low voltage circuit 10b, and the low voltage circuit 10b operates by applying the DC low voltage. A microcomputer mounted on the low voltage circuit 10b performs control so that desired three-phase AC power according to the situation is generated, for example, by outputting a predetermined drive signal depending on the detection result of various sensors to each switching element SW.

Further, the board main body portion 10 according to the first embodiment is a multilayer wiring board formed by laminating a plurality of layers. In an area of the board main body portion 10 on which the high voltage circuit 10a is mounted, at least a power supply pattern layer patterned with the power supply wiring to which the high voltage is applied, and a ground (GND) pattern layer on which a ground pattern to be grounded is patterned are stacked.
(Structure of High Voltage Circuit)

Next, the structure of the high voltage circuit 10a will be described in more detail with reference to FIGS. 1 to 5.

As illustrated in FIGS. 1 to 5, in the high voltage circuit 10a, a high voltage input terminal 10a1, an RC circuit 10a2, a switching element SW, a bus bar support member 20, a capacitor C, and an inductor L are electrically connected to each other.

In the following description, the power conversion circuit board 1 will be mainly described with reference to FIG. 3 as seen from the bottom side (the −Z direction side). Here, a +X direction side in FIG. 3 is referred to as a left side (a left end side), a −X direction side is referred to as a right side (a right end side), a +Y direction side is referred to as an upper side (an upper end side), and a −Y direction side is referred to as a lower side (a lower end side) and the like.

The high voltage input terminal 10a1 is mounted on the board surface on the back side (−Z direction side) of the board main body portion 10 and on the left end side (+X direction side) of the board main body portion 10 (see FIG. 3). A separately mounted battery is electrically connected to the high voltage input terminal 10a1, and a DC high voltage is applied from the battery. A capacitor C and an inductor L for high voltage are mounted on the board surface on the opposite side (+Z direction side) of the surface on which the high voltage input terminal 10a1 is mounted (see FIG. 2). The DC high voltage from the battery can be stabilized by the capacitor C and the inductor L for high voltage.

The DC high voltage which is input from the high voltage input terminal 10a1 is input to the six switching elements SW mounted on the right end side, via the RC circuit 10a2 similarly disposed on the right end side (the −X direction side) of the high voltage circuit 10*a*.

The RC circuit 10*a*2 is a circuit in which a resistance element and a capacitor element are electrically connected, and functions as a low-pass filter that removes high frequency components. At least a part of the RC circuit 10*a*2 is mounted on the board surface of the board main body portion 10 in a space between the bus bar support member 20 and the board main body portion 10 to be described later (see FIG. 3 and the like).

The six switching elements SW are mounted on the lower side (the −Y direction side) of the RC circuit 10*a*2 in the board main body portion 10.

The bus bar support member 20 is disposed on the board surface of the back surface side (the −Z direction side) of the board main body portion 10 to be adjacent to the left side (+X direction side) of the area in which the six switching elements SW are mounted.

The bus bar support member 20 is disposed at a position spaced apart from the board surface on the back surface side of the board main body portion 10 by a predetermined distance (see FIG. 4). Three bus bars corresponding to each of the U-phase, V-phase, and W-phase are mounted inside the bus bar support member 20.

The three bus bars mounted inside the bus bar support member 20 extend from the bus bar connection terminals 20*a* located on the lower end side (the −Y direction side) of the bus bar support member 20 to the high voltage output terminal 20*b* located on the upper end side (+Y direction side) of the bus bar support member 20, while maintaining a certain distance from the board surface of the board main body portion 10. In the above constitution, the three bus bars are disposed to cross over above the high voltage circuit 10*a* mounted from the left end side to the right end side of the board surface of the board main body portion 10.

The three bus bars mounted inside the bus bar support member 20 are electrically connected to the wiring mounted on the board surface of the board main body portion 10 at the bus bar connection terminal 20*a*. The AC power of each phase generated by the ON/OFF drive of the switching element SW is input to the corresponding bus bar via the bus bar connection terminal 20*a*. The AC power corresponding to each of the U-phase, the V-phase, and the W-phase is output from the high voltage output terminal 20*b* of each phase, via a bus bar extending from the bus bar connection terminal 20*a* located on the lower end side of the bus bar support member 20 to the upper end side.

In this way, when the power conversion circuit board 1 is viewed from the bottom side, the high voltage circuit 10*a* mounted on the power conversion circuit board 1 is disposed such that a wiring from the high voltage input terminal 10*a*1 of the high voltage circuit 10*a* to the switching element SW, and a wiring from the switching element SW to the high voltage output terminal 20*b* intersect with each other.

The board main body portion 10 according to the first embodiment has a plurality of series capacitor groups 10*a*3, which are capacitor elements provided for the purpose of reducing the electromagnetic noise, connected between a power supply wiring to which a high voltage is applied in the high voltage circuit 10*a* and a ground wiring to be grounded. The series capacitor group 10*a*3 is formed by connecting a plurality of (for example, five) capacitor elements (for example, on the order of several thousands of pF per element) in series (see FIGS. 2 and 3). Each capacitor element may be, for example, a general ceramic capacitor or the like.

As illustrated in FIGS. 2, 3, and the like, in the present embodiment, the series capacitor groups 10*a*3 are mounted at the same position (the positions overlapping each other when viewed from the +Z direction side or the −Z direction side) on the front surface side (the surface on the +Z direction side) of the board main body portion 10 and the back surface side (the surface on the −Z direction side) of the board main body portion 10. Further, the two sets of series capacitor groups 10*a*3 mounted at the same position on the front surface side and the back surface side are mounted so that the arrangement patterns of the plurality of capacitor elements are the same.

In the board main body portion 10 according to the first embodiment, a fixing hole 11 for attachment to a housing of an electric compressor (not illustrated) is provided. The power conversion circuit board 1 is screwed to the housing of the electric compressor through the fixing hole 11.

A plurality of fixing holes 11 are also provided near the center of the board main body portion 10 (see FIGS. 2 and 3), in addition to each of the four corners of the board main body portion 10. At the edge of the fixing hole 11, a grounding land connected to the ground wiring is provided. As a result, when the fixing hole 11 is screwed, the power conversion circuit board 1 is grounded through the grounding land provided at the edge of the fixing hole 11.

Further, the series capacitor group 10*a*3 is mounted in the vicinity of the fixing holes 11 to correspond to each of the fixing holes 11 (see FIGS. 2 and 3).

(Characteristics of Series Capacitor Group)

Figure 6A:
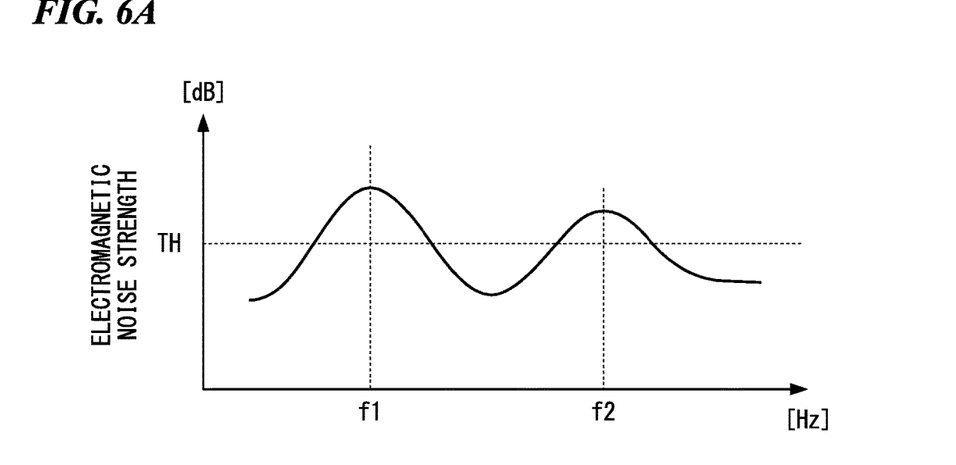
FIG. 6A is a first diagram illustrating the characteristics of a series capacitor group according to the first embodiment.

FIG. 6A is a first diagram illustrating the characteristics of the series capacitor group according to the first embodiment.

Figure 6B:
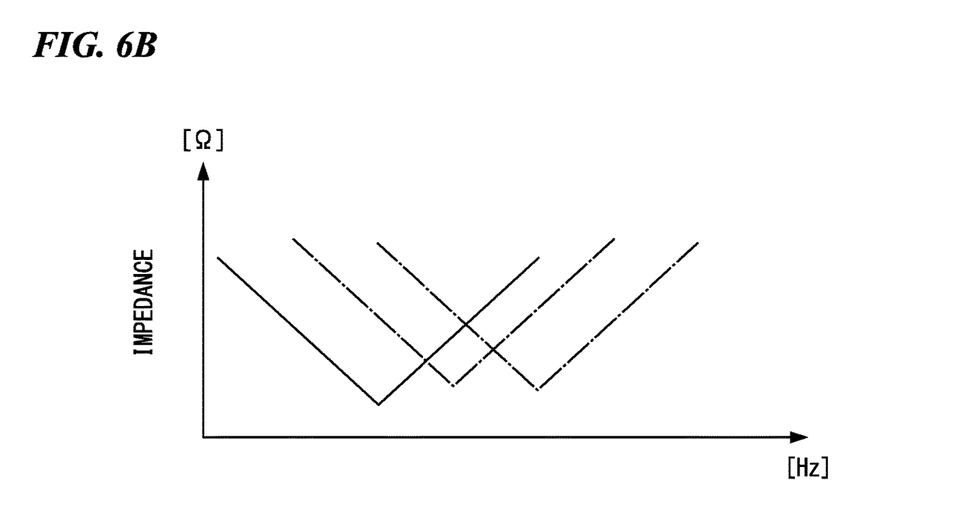
FIG. 6B is a second diagram illustrating the characteristics of the series capacitor group according to the first embodiment.

FIG. 6B is a second diagram illustrating the characteristics of the series capacitor group according to the first embodiment.

The graph illustrated in FIG. 6A illustrates an example of the frequency characteristics of electromagnetic noise generated from the power conversion circuit board 1 (a vertical axis represents the noise intensity [dB] and a horizontal axis represents the frequency [Hz]). Further, the graph illustrated in FIG. 6B illustrates an example of the frequency characteristics of the impedance of each capacitor element constituting the series capacitor group 10*a*3 (a vertical axis represents the impedance [Ω] and the horizontal axis represents the frequency [Hz]).

Here, the electromagnetic noise radiated from the power conversion circuit board 1 has a frequency characteristic unique to the product due to the characteristics of the element to be mounted, its circuit pattern, applied voltage, operating frequency, and the like. For example, as illustrated in FIG. 6A, the electromagnetic noise of the power conversion circuit board 1 exhibits intensity higher than a predetermined value TH at a plurality of different frequencies f1 and f2.

In this case, the five capacitor elements constituting the series capacitor group 10*a*3 are selected to be able to reduce the electromagnetic noise at the plurality of frequencies f1 and f2, to correspond to the plurality of frequencies f1 and f2 at which the electromagnetic noise is equal to or greater than the specified value TH.

Specifically, the impedance (Ω) of the capacitor element has a frequency characteristic as illustrated in FIG. 6B. That is, due to the resonance characteristic, there is a frequency band in which the impedance locally decreases.

The frequency characteristics of the impedance of the capacitor element differ depending on the type or the like of the capacitor element to be selected. Therefore, in the impedances of each capacitor element constituting the series capacitor group, by combining the frequency characteristics of different impedances to correspond to the frequencies f1 and f2 with strong electromagnetic noise, the electromagnetic noise of the desired frequency (frequencies f1, f2, etc.) can be effectively reduced.

(Operational Effect)

Figure 7:
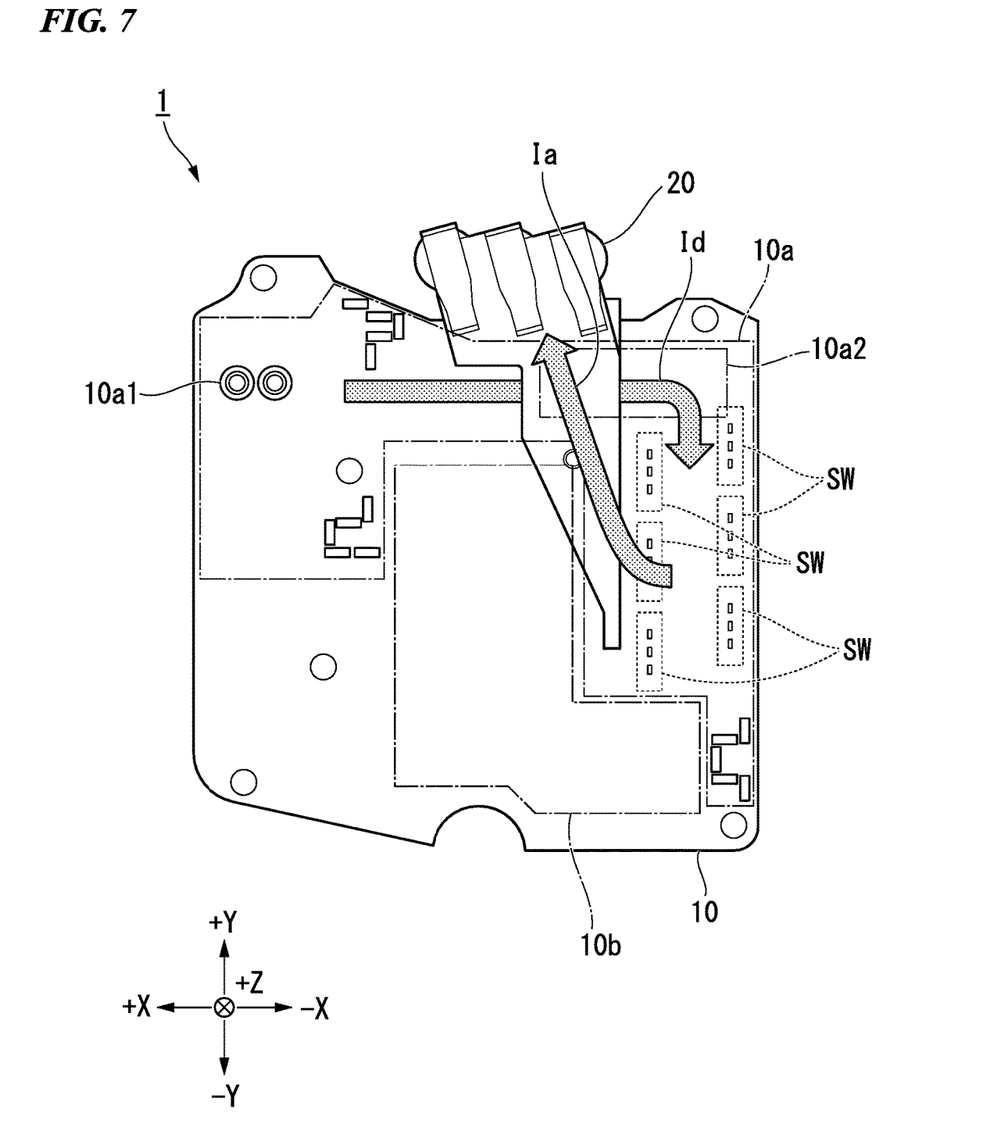
FIG. 7 is a diagram illustrating operational effects based on the structure of the high voltage circuit according to the first embodiment.

FIG. 7 is a diagram illustrating the operational effect based on the structure of the high voltage circuit according to the first embodiment.

According to the power conversion circuit board 1 of the first embodiment, as illustrated in FIG. 7, the low voltage circuit 10b to which a low voltage is applied and the high voltage circuit 10a to which a high voltage is applied are separately disposed one by one in different areas of the same board surface.

In this way, since the high voltage circuit 10a and the low voltage circuit 10b are separately disposed, it is possible to reduce the degree of interference of the electromagnetic noise radiated from the high voltage circuit 10a to the low voltage circuit 10b. Further, since the high voltage circuit 10a and the low voltage circuit 10b are disposed on the same board surface, space saving can be achieved.

As described above, according to the power conversion circuit board 1, it is possible to reduce the influence of electromagnetic noise, while maintaining the space-saving property.

Further, in the power conversion circuit board 1 according to the first embodiment, as illustrated in FIG. 7, in the high voltage circuit 10a, a wiring (a wiring through which the direct current Id flows) from the high voltage input terminal 10a1 to the switching element SW is formed on the board surface of the board main body portion 10, and the wiring (the wiring through which the alternating current Ia flows) from the switching element SW to the high voltage output terminal 20b comprises a bus bar which is provided at a predetermined distance from the board surface.

In this way, electromagnetic noise (ringing noise or the like) generated by driving of the switching element SW is absorbed between the wiring formed on the board surface of the board main body portion 10 and the bus bar provided at a predetermined distance from the board surface, in addition to the RC circuit 10a2. Thus, electromagnetic noise can be prevented from being radiated to the outside.

Further, according to the power conversion circuit board 1 of the first embodiment, the wiring from the high voltage input terminal 10a1 to the switching element SW and the wiring from the switching element SW to the high voltage output terminal 20b are disposed to intersect with each other. In other words, the wiring (the wiring mounted on the board surface of the board main body portion 10a) of the high voltage circuit 10a through which the direct current Id flows, and the wiring of the high voltage circuit 10a through which the alternating current Id flows (the bus bar supported by the bus bar support member 20) are configured to three-dimensionally intersect with each other.

In this way, since the electromagnetic noise generated by driving of the switching element SW is effectively absorbed by the portions in which the electromagnetic noises intersect with each other, it is possible to more effectively suppress the electromagnetic noise from being radiated to the outside.

Further, by adopting the three-dimensionally intersecting structure, the region of the power conversion circuit board 1 occupied by the high voltage circuit 10a can be compactly integrated into one. Therefore, the entire power conversion circuit board 1 can be further downsized (space-saving).

Further, according to the power conversion circuit board 1 of the first embodiment, at least a part of the RC circuit 10a2 is provided in the space provided between the wiring from the high voltage input terminal 10a1 to the switching element SW and the wiring from the switching element SW to the high voltage output terminal.

In this way, it is possible to obtain an effect of removing electromagnetic noise on the basis of the function of the RC circuit 10a2 as a low-pass filter. Further, in order to secure the space required for mounting the RC circuit 10a2, it is possible to effectively utilize the space provided between the wiring from the high voltage input terminal 10a1 to the switching element SW and the wiring from the switching element SW to the high voltage output terminal. Therefore, it is possible to achieve further space saving of the power conversion circuit board 1.

Further, according to the power conversion circuit board 1 of the first embodiment, the high voltage circuit 10a has a series capacitor group 10a3 including a plurality of capacitor elements connected in series between the power supply wiring and the ground wiring.

In this way, since the voltage applied to one capacitor element is divided and reduced, it is possible to enhance the voltage resistance performance of the high voltage circuit 10a. Even if one of the capacitor elements is broken and short-circuited, it is possible to prevent the power supply wiring and the ground wiring from being short-circuited by the other capacitor elements connected in series.

Furthermore, in this way, since it is possible to select each capacitor element constituting the series capacitor group 10a3 as desired, the impedance characteristics of the series capacitor group 10a3 as a whole can be properly controlled in accordance with the electromagnetic noise specific to the product.

As described above, it is possible to reduce the influence of electromagnetic noise on the external device and to further attain a high breakdown voltage.

Further, according to the power conversion circuit board 1 of the first embodiment, each capacitor element constituting the series capacitor group 10a3 has different impedance characteristics (frequency characteristics of impedance) which enable reduction of electromagnetic noise at the plurality of frequencies to correspond to the plurality of frequencies at which the electromagnetic noise is equal to or more than the specified value TH (FIG. 6A).

In this way, it is possible to effectively reduce the electromagnetic noise of a desired frequency, by combining the frequency characteristics of different impedances to correspond to the frequencies with strong electromagnetic noise (frequencies f1 and f2 of FIG. 6A).

Further, according to the power conversion circuit board 1 according to the first embodiment, the series capacitor group 10a3 is mounted at the same position on the front surface side and the back surface side of the board main body portion 10.

Also, two sets of series capacitor groups 10a3 mounted at the same position on the front surface side and the back surface side of the board main body portion 10 are mounted so that the arrangement patterns of the plurality of capacitor elements are the same.

A floating capacitance corresponding to each positional relationship is assumed to be formed between the capacitor elements. Therefore, by making the arrangement pattern the same, it is possible to equalize the capacitance values of the series capacitor group 10a3 on the front surface side and the back surface side, including the floating capacitance according to the arrangement pattern.

Modified Example of First Embodiment

Although the power conversion circuit board 1 according to the first embodiment has been described in detail above, the specific aspects of the power conversion circuit board 1 are not limited to the above-described aspects, and various design changes and the like can be added within the scope that does not depart from the gist of the present invention.

For example, in the first embodiment, the power conversion circuit board 1 has been described as being disposed such that the wiring from the high voltage input terminal 10*a*1 to the switching element SW and the wiring from the switching element SW to the high voltage output terminal 20*b* intersect with each other. However, other embodiments are not limited thereto.

That is, in the power conversion circuit board 1 according to another embodiment, the wiring from the high voltage input terminal 10*a*1 to the switching element SW, and the wiring from the switching element SW to the high voltage output terminal 20*b* do not necessarily intersect with each other. For example, an aspect in which at least part of both of them extends while overlapping may be adopted.

Although the aspect in which the RC circuit 10*a*2 is connected to the power conversion circuit board 1 for the purpose of reducing electromagnetic noise according to the driving of the switching element SW has been described in the first embodiment, other embodiments are not limited thereto.

That is, the power conversion circuit board 1 according to another embodiment may be an aspect that does not include the RC circuit 10*a*2. In this case, the power conversion circuit board 1 according to another embodiment may be an aspect in which only the lands on which the RC circuit 10*a*2 can be mounted are formed.

By providing only the region for mounting the RC circuit 10*a*2 in this manner, it is possible to select whether to mount or not to mount the RC circuit 10*a*2 in accordance with a customer's request (degree of electromagnetic noise to be reduced).

While several embodiments of the invention have been described, these embodiments are presented by way of example and are not intended to limit the scope of the invention. These embodiments can be provided in various other forms, and various omissions, substitutions, and changes can be made within the scope that does not depart from the gist of the invention. These embodiments and modifications thereof are included in the scope or the gist of the invention, and are included within the invention described in the claims and the equivalent scope thereof.

INDUSTRIAL APPLICABILITY

According to the above-described power conversion circuit board and electric compressor, it is possible to reduce the influence of electromagnetic noise, while maintaining the space-saving property.

REFERENCE SIGNS LIST

1 Power conversion circuit board
10 Board main body portion
10*a* High voltage circuit
10*a*1 High voltage input terminal
10*a*2 RC circuit
10*a*3 Series capacitor group
10*b* Low voltage circuit
11 Fixing hole
20 Bus bar support member
20*a* Bus bar connection terminal
20*b* High voltage output terminal
SW Switching element
C Capacitor
L Inductor

The invention claimed is:

1. A power conversion circuit board on which a power conversion circuit configured to convert direct current to alternating current is mounted,
   wherein a low voltage circuit to which a low voltage is applied and a high voltage circuit to which a high voltage is applied are separately disposed in different areas on the same board surface, and
   in the high voltage circuit, a wiring from a high voltage input terminal to a switching element is formed on the board surface, and a wiring from the switching element to a high voltage output terminal comprises a bus bar which is provided at a predetermined distance from the board surface, and
   wherein the wiring from the high voltage input terminal to the switching element and the wiring from the switching element to the high voltage output terminal are disposed to three-dimensionally intersect with each other.

2. The power conversion circuit board according to claim 1, wherein at least a part of an RC circuit is provided in a space provided between the wiring from the high voltage input terminal to the switching element and the wiring from the switching element to the high voltage output terminal.

3. An electric compressor comprising:
   the power conversion circuit board according to claim 1; and
   a motor which operates on the basis of AC power supplied from the power conversion circuit board.

4. An electric compressor comprising:
   the power conversion circuit board according to claim 2; and
   a motor which operates on the basis of AC power supplied from the power conversion circuit board.

* * * * *